US 8,595,657 B2

(12) United States Patent
Cha et al.

(10) Patent No.: US 8,595,657 B2
(45) Date of Patent: Nov. 26, 2013

(54) METHODS OF FORMING A PHOTO MASK

(75) Inventors: Hosun Cha, Goyang-si (KR); Eunmi Lee, Yongin-si (KR); Sungwoo Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 67 days.

(21) Appl. No.: 13/366,553

(22) Filed: Feb. 6, 2012

(65) Prior Publication Data

US 2012/0202351 A1  Aug. 9, 2012

(30) Foreign Application Priority Data

Feb. 8, 2011  (KR) .................. 10-2011-0011149

(51) Int. Cl.
  G06F 17/50  (2006.01)
  G06F 19/00  (2011.01)
  G03F 1/00  (2012.01)
  G21K 5/00  (2006.01)
(52) U.S. Cl.
  CPC ............ G06F 17/5081 (2013.01); G06F 19/00 (2013.01); G03F 1/00 (2013.01); G21K 5/00 (2013.01)
  USPC .................. 716/53; 716/52; 716/54; 716/55; 716/112; 700/110; 700/120; 700/121; 700/98; 378/35; 430/5
(58) Field of Classification Search
  CPC ....... G06F 17/5081; G06F 19/00; G03F 1/00; G21K 5/00
  USPC ............ 716/53, 52, 54, 55, 112; 700/98, 110, 700/120, 121; 378/35; 430/5
  See application file for complete search history.

(56) References Cited

U.S. PATENT DOCUMENTS

| 6,573,499 | B1 | 6/2003 | Sasajima et al. | |
| 6,934,929 | B2 | 8/2005 | Brist et al. | |
| 7,340,706 | B2* | 3/2008 | Golubtsov et al. | 716/52 |
| 7,587,704 | B2* | 9/2009 | Ye et al. | 716/51 |
| 7,617,477 | B2* | 11/2009 | Ye et al. | 716/56 |
| 7,791,021 | B2 | 9/2010 | Sasajima et al. | |
| 7,827,520 | B2* | 11/2010 | Choi | 716/52 |
| 7,941,768 | B1* | 5/2011 | Wei | 716/54 |
| 8,271,910 | B2* | 9/2012 | Tirapu-Azpiroz et al. | 716/54 |
| 2004/0038139 | A1* | 2/2004 | Mui et al. | 430/30 |
| 2007/0061772 | A1* | 3/2007 | Ye et al. | 716/21 |
| 2007/0061773 | A1* | 3/2007 | Ye et al. | 716/21 |
| 2007/0079277 | A1* | 4/2007 | Golubtsov et al. | 716/19 |
| 2007/0079278 | A1* | 4/2007 | Tanaka et al. | 716/21 |
| 2007/0162887 | A1* | 7/2007 | Suh et al. | 716/21 |
| 2008/0022255 | A1* | 1/2008 | Zach | 716/19 |

(Continued)

FOREIGN PATENT DOCUMENTS

| JP | 2001110862 | 4/2001 |
| KR | 1020060074537 | 2/2012 |

*Primary Examiner* — Phallaka Kik
(74) *Attorney, Agent, or Firm* — Onello & Mello LLP (57) ABSTRACT

Methods of fabricating a photo mask are provided. The method includes collecting sample data, setting a preliminary mask layout, performing an optical proximity correction using the sample data and a preliminary mask layout to obtain an optimized preliminary mask layout, verifying the optimized preliminary mask layout to obtain a final mask layout, and fabricating the photo mask using the final mask layout. Verification of the optimized preliminary mask layout includes operating a verification simulator using the sample data and the optimized preliminary mask layout as input data to obtain verification image data. The verification image data includes a plurality of contours of a pattern at different vertical positions.

22 Claims, 7 Drawing Sheets

(56) References Cited

U.S. PATENT DOCUMENTS

| | | | |
|---|---|---|---|
| 2008/0183412 A1* | 7/2008 | Funk et al. | 702/97 |
| 2008/0295059 A1* | 11/2008 | Choi | 716/19 |
| 2009/0020699 A1 | 1/2009 | Sasajima et al. | |
| 2009/0249261 A1* | 10/2009 | Kim et al. | 716/2 |
| 2010/0314541 A1 | 12/2010 | Sasajima et al. | |
| 2011/0239167 A1* | 9/2011 | Rathsack | 716/50 |
| 2011/0239169 A1* | 9/2011 | Tirapu-Azpiroz et al. | 716/55 |
| 2012/0228743 A1* | 9/2012 | Park et al. | 257/618 |

* cited by examiner

METHODS OF FORMING A PHOTO MASK

CROSS-REFERENCE TO RELATED APPLICATIONS

This U.S. non-provisional patent application claims priority under 35 U.S.C. §119 to Korean Patent Application No. 10-2011-0011149, filed on Feb. 8, 2011, in the Korean Intellectual Property Office, the entire contents of which are incorporated herein by reference.

BACKGROUND

1. Technical Field

The present inventive concepts relate to a photolithography technique and, more particularly, to methods of forming a photo mask.

2. Description of Related Art

A photolithography technique used in fabrication of a semiconductor device may generally employ a method of transferring pattern images of a photo mask onto a wafer through optical lenses of an optical system. However, as semiconductor devices become more highly integrated, the sizes of the mask patterns are becoming increasingly closer to a wavelength of a light emitted from a light source of the optical system. As a result, the photolithography technique may be increasingly influenced by diffraction and/or interference of the light of the optical system. In particular, the optical system projecting the pattern images may act as a low-pass filter. Thus, photoresist patterns formed on the wafer may exhibit poor profiles which are distorted relative to the original mask patterns.

In more detail, if the size (or period) of the mask patterns formed on the photo mask increases, a spatial frequency of the mask patterns may decrease. In this case, the photo mask may transmit a light having a relatively high order of frequency. Thus, the photoresist patterns formed on the wafer may exhibit a profile that is similar to the original mask patterns. However, a high frequency area such as a corner region may still be formed to have a distorted image. This image distortion effect is referred to as an optical proximity effect (OPE). The more the size of the mask patterns is reduced, the higher the spatial frequency of the mask patterns becomes. Thus, if the size of the mask patterns is reduced, severe image distortion can occur due to the optical proximity effect.

SUMMARY

Embodiments of the inventive concepts are directed to methods of forming a photo mask.

In one aspect of the inventive concepts, the method comprises collecting sample data, setting a preliminary mask layout to obtain target mask layout data, performing an optical proximity correction using the sample data and a preliminary mask layout to obtain an optimized preliminary mask layout, verifying the optimized preliminary mask layout to obtain a final mask layout, and fabricating the photo mask using the final mask layout. Verification of the optimized preliminary mask layout includes operating a verification simulator using the sample data and the optimized preliminary mask layout as input data to obtain verification image data. The verification image data includes a plurality of contours of a pattern at different vertical positions.

In some embodiments, the verification of the optimized preliminary mask layout may further comprise comparing the verification image data with the target mask layout data to detect a verification error and determining whether the verification error is out of an allowable range. In some embodiments, the verification image data may further include a plurality of critical dimensions of the pattern at different vertical positions, a sidewall profile and a corner angle. In some embodiments, the comparison between the verification image data and the target mask layout data may include comparing the plurality of contours of the pattern to detect a sub-resolution assist feature and a side lobe. In another embodiment, the comparison between the verification image data and the target mask layout data may include calculating a difference between the plurality of critical dimensions of the pattern to detect a bridge or a necking. In another embodiment, the comparison between the verification image data and the target mask layout data may includes calculating the corner angle to detect a bridge or a necking. In some embodiments, if the verification error is out of the allowable range, the preliminary mask layout may be compensated and the optical proximity correction and the verification of the optimized preliminary mask layout may be again performed using the compensated preliminary mask layout. In another embodiment, if the verification error is out of the allowable range, the target mask layout data may be reset and the optical proximity correction and the verification of the optimized preliminary mask layout may be again performed using the reset target mask layout data. In another embodiment, the method further includes generating an alarm message indicating the verification error when the verification error is out of the allowable range.

In some embodiments, performing the optical proximity correction may include operating a model simulator using the sample data and the preliminary mask layout as input data to obtain a model image data in which an optical proximity effect is reflected, comparing the model image data with the target mask layout data to detect a model error, and determining whether the model error is out of an allowable range. In some embodiments, if the model error is out of the allowable range, the preliminary mask layout may be compensated and the optical proximity correction and the verification of the optimized preliminary mask layout may be again performed using the compensated preliminary mask layout. The verification simulator may be different from the model simulator.

In some embodiments, collecting the sample data may include performing exposure and development processes using a test mask to form photoresist patterns and measuring various parameters of the photoresist patterns. The test mask may include test patterns having various sizes, various shapes and various spaces. The various parameters of the photoresist patterns may include thicknesses, corner angles, sidewall profiles, critical dimensions at different vertical positions, and contours. Measuring the various parameters of the photoresist patterns may be performed using a top-view critical dimension scanning electron microscope (CD SEM) or an angled critical dimension scanning electron microscope (CD SEM).

In another aspect of the inventive concepts, a method of fabricating a photo mask includes collecting sample data, setting a target mask layout data and performing an optical proximity correction using the sample data and a preliminary mask layout to obtain an optimized preliminary mask layout. The method further includes verifying the optimized preliminary mask layout by generating verification image data and comparing the verification image data with the target mask layout data to detect a verification error, generating an alarm message indicating the verification error when the verification error is out of the allowable range and obtaining a final mask layout when the verification error is within the allowable range and fabricating the photo mask using the final mask layout.

In some embodiments, verifying the optimized preliminary mask layout includes operating a verification simulator using the sample data and the optimized preliminary mask layout as input data to obtain the verification image data. The verification image data includes a plurality of contours of a verification-simulated pattern at different vertical positions.

In some embodiments, verifying the optimized preliminary mask layout further comprises determining whether the verification error is out of an allowable range. The verification image data further include a plurality of critical dimensions of the verification-simulated pattern at different vertical positions, a sidewall profile and a corner angle.

In some embodiments, comparing the verification image data with the target mask layout data to detect a verification error includes comparing the plurality of contours of the pattern to detect a sub-resolution assist feature and a side lobe.

In some embodiments, comparing the verification image data with the target mask layout data to detect a verification error comprises at least one of calculating a difference between the plurality of critical dimensions of the verification-simulated pattern to detect a bridge or a necking and calculating the corner angle to detect a bridge or a necking.

In some embodiments, if the verification error is out of the allowable range, the preliminary mask layout is compensated and the optical proximity correction and the verification of the optimized preliminary mask layout are again performed using the compensated preliminary mask layout or the target mask layout data is reset and the optical proximity correction and the verification of the optimized preliminary mask layout are again performed using the reset target mask layout data.

In some embodiments, performing the optical proximity correction comprises operating a model simulator using the sample data and the preliminary mask layout as input data to obtain a model image data in which an optical proximity effect is reflected, comparing the model image data with the target mask layout data to detect a model error and determining whether the model error is out of an allowable range. If the model error is out of the allowable range, the preliminary mask layout is compensated and the optical proximity correction and the verification of the optimized preliminary mask layout are again performed using the compensated preliminary mask layout.

BRIEF DESCRIPTION OF THE DRAWINGS

The foregoing and other features and advantages of the inventive concepts will be apparent from the detailed description of embodiments of the inventive concepts contained herein, as illustrated in the accompanying drawings, in which like reference characters refer to the same parts or elements throughout the different views. The drawings are not necessarily to scale, emphasis instead being placed upon illustrating the principles of the inventive concepts. In the drawings, the thickness of layers and regions may be exaggerated for clarity.

DETAILED DESCRIPTION OF THE EMBODIMENTS

Various exemplary embodiments will be described more fully hereinafter with reference to the accompanying drawings, in which some exemplary embodiments of the inventive concepts are shown. The present inventive concepts may, however, be embodied in many different forms and should not be construed as limited to the exemplary embodiments set forth herein.

The terminology used herein is for the purpose of describing particular example embodiments only and is not intended to be limiting of the present inventive concepts. As used herein, the singular terms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements components and/or groups thereof.

Similarly, it will be understood that when an element or layer is referred to as being "on," "connected to" or "coupled to" another element or layer, it can be directly on, connected or coupled to the other element or layer or intervening elements or layers may be present. In contrast, when the element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

Additionally, the example embodiments are described with reference to cross-sectional illustrations that are schematic illustrations of idealized exemplary embodiments) and intermediate structures. As such, variations from the shapes of the illustrations as a result, for example, of manufacturing techniques and/or tolerances are to be expected. Therefore, the example embodiments of the inventive concepts should not be construed as limited to the particular shapes of regions illustrated herein, but may include deviations in shapes that result, for example, from manufacturing processes. Thus, the regions illustrated in the figures are schematic in nature and their shapes are not intended to illustrate the actual shape of a region of a device and are not intended to limit the scope of the inventive concepts.

It will be also understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present inventive concepts.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Optical proximity correction techniques have been applied in order to overcome the optical proximity effect which is a primary factor of the image distortion. Such techniques compensate for image distortion with intentional changes of shapes of the mask patterns. Accordingly, such techniques may improve an optical resolution and a pattern transferring fidelity in the photolithography area.

Figure 1:
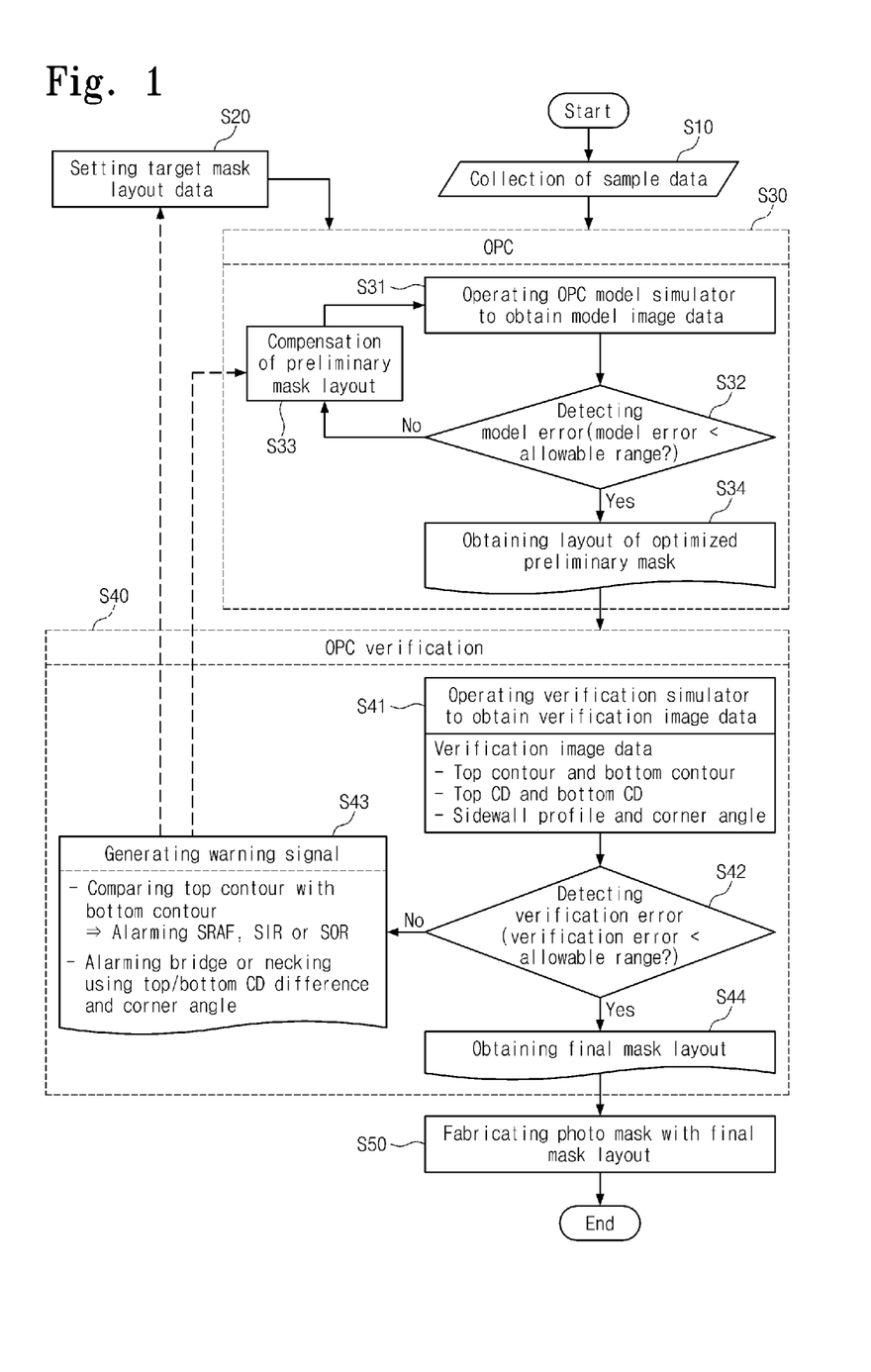
FIG. 1 is a process flow chart illustrating methods of fabricating a photo mask according to an example embodiment of the inventive concepts.
Figure 2A:
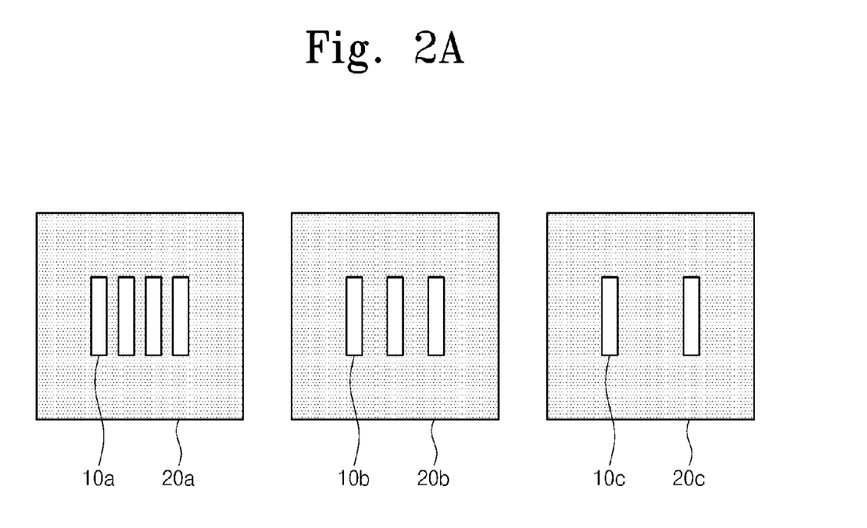
FIG. 2A is a schematic layout view illustrating test masks used in a step of collecting sample data according to an example embodiment of the inventive concepts.

FIG. 1 is a process flow chart illustrating methods of fabricating a photo mask according to an example embodiment of the inventive concepts. FIG. 2A is a schematic layout view illustrating test masks used in a step of collecting sample data according to an example embodiment of the inventive concepts, FIG. 2B is a schematic cross-sectional view illustrating a step of collecting sample data according to an example embodiment of the inventive concepts, and FIG. 2C is an angled critical dimension scanning electron microscope (CD SEM) picture obtained according to an example embodiment of the inventive concepts.

Figure 2B:
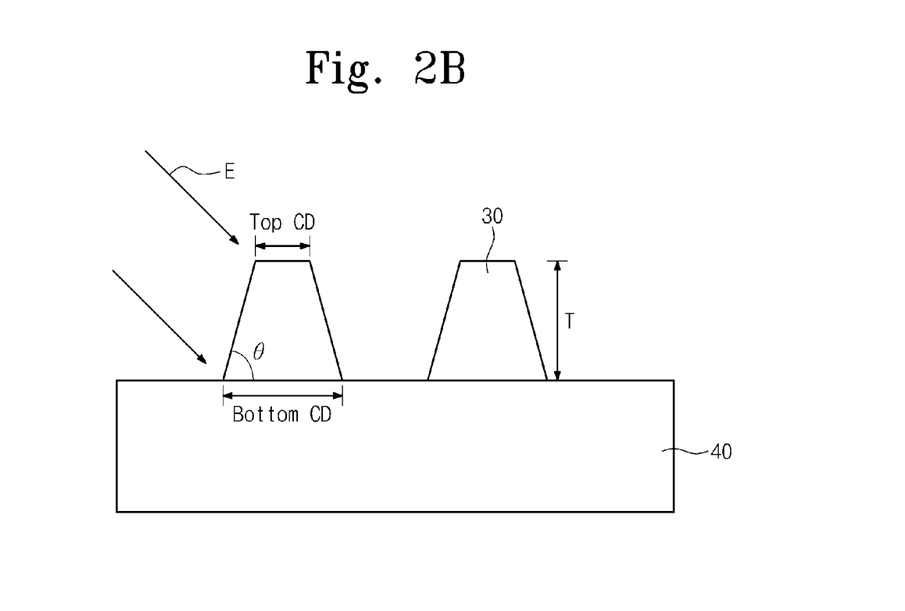
FIG. 2B is a schematic cross-sectional view illustrating a step of collecting sample data according to an example embodiment of the inventive concepts.

Referring to FIGS. 1, 2A and 2B, a method of fabricating a photo mask according to an example embodiment of the inventive concepts may include a step of collecting sample data (S10). The step of collecting sample data (S10) may include coating a photoresist layer on a substrate 40 and applying exposure and development processes to the photoresist layer to form photoresist patterns 30. The photoresist patterns 30 may be formed using test masks 20a, 20b and 20c including test patterns 10a, 10b and 10c that have various sizes, various shapes and various spaces. Subsequently, various parameters of the photoresist patterns 30 may be measured. The various parameters of the photoresist patterns 30 may include a thickness T, a corner angle θ, a sidewall profile, critical dimensions (CDs) at different vertical positions (for example, top and bottom CDs), and top and bottom contours of the respective photoresist patterns 30. The step of measuring the parameters of the photoresist patterns 30 may be performed using a top-view critical dimension scanning electron microscope (CD SEM) or an angled critical dimension scanning electron microscope (CD SEM). In the event that the parameters of the respective photoresist patterns 30 are measured using the top-view CD SEM, electron beams may be irradiated onto a top surface of the respective photoresist patterns 30 at a right angle to a top surface of the substrate 40 to obtain pattern images of the respective photoresist patterns 30. In the event that the parameters of the respective photoresist patterns 30 are measured using the angled CD SEM, electron beams E may be irradiated onto a top surface of the respective photoresist patterns 30 at a tilted or acute (for example, non-perpendicular) angle relative to a top surface of the substrate 40 to obtain the pattern images of the respective photoresist patterns 30, as illustrated in FIG. 2B.

Figure 2C:
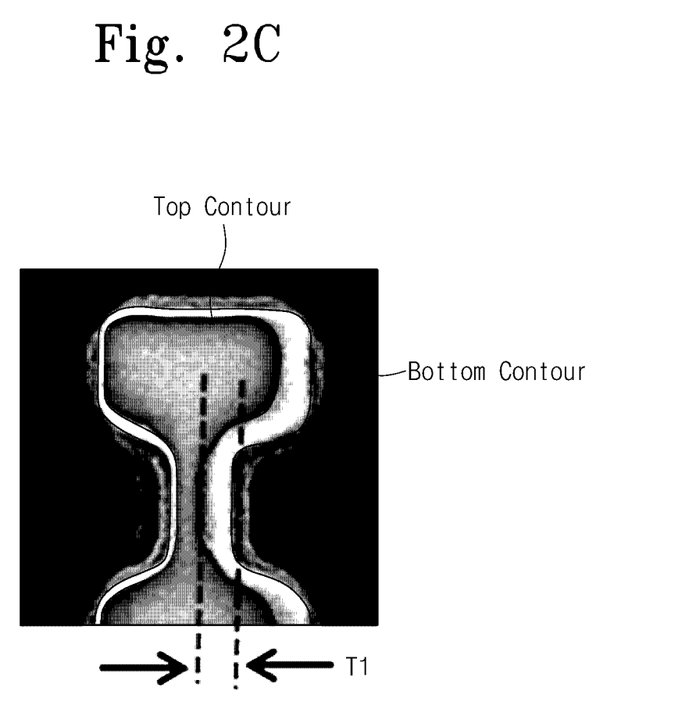
FIG. 2C is an angled critical dimension scanning electron microscope (CD SEM) picture obtained according to an example embodiment of the inventive concepts.

FIG. 2C illustrates an example of the pattern images of the photoresist patterns 30 obtained using the angled CD SEM. Referring to FIG. 2C, a top contour, a bottom contour and a thickness T1 of each of the photoresist patterns 30 may be measured from the pattern image obtained using the angled CD SEM. Further, a top CD, a bottom CD, an actual thickness and a corner angle of the photoresist pattern 30 may be calculated using the top contour, the bottom contour, the thickness T1 and the tilted irradiation angle of the electron beams E. Using the above methods, the three dimensional parameters of the respective photoresist patterns 30 exposed in diverse environments may be collected to form sample data.

Figure 3:
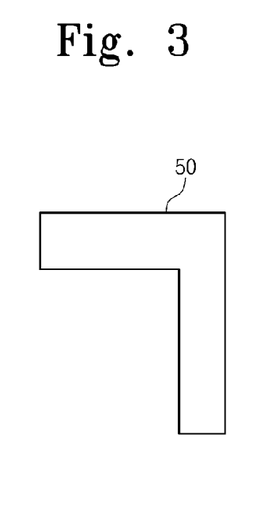
FIG. 3 is a schematic target mask layout view according to an example embodiment of the inventive concepts.

Next, referring to FIG. 1, a target mask layout data may be set and/or determined (S20). The target mask layout data may correspond to layout data (for example, CDs, contours, corner angles and sidewall profiles) of desired photoresist patterns to be ideally formed after the exposure and development processes. FIG. 3 is a schematic target mask layout view according to an example embodiment of the inventive concepts. For example, a layout 50 in FIG. 3 may be one of the target mask layout data.

Figure 4:
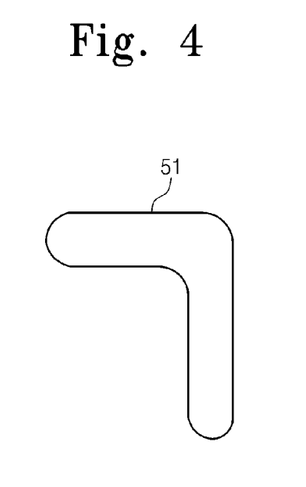
FIG. 4 is a schematic layout view illustrating an image contour obtained from a model simulator with the layout data illustrated in FIG. 3.

Referring again to FIG. 1, an optical proximity correction (OPC) may be performed (S30). The optical proximity correction may include operating a model simulator using the sample data and a preliminary mask layout as input data to obtain model image data in which an optical proximity effect is reflected (S31). For example, the layout of FIG. 3 may be set as a preliminary mask layout, and the model simulator may operate using the preliminary mask layout and the sample data as input data to generate a model image contour 51, as illustrated in FIG. 4, as the model image data.

The model image data, for example, the model image contour 51, and the target mask layout data may be compared with each other to detect a model error (S32). While the model image data, for example, the model image contour 51, is compared with the target mask layout data, a critical dimension CD difference between the model image data and the target mask layout data may be calculated and contours of the model image data and the target mask layout data may be compared to detect whether a necking feature or a bridge feature is present.

Figure 5:
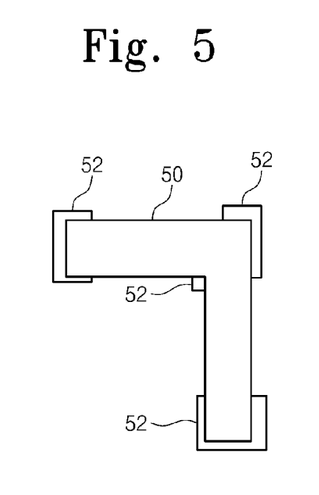
FIG. 5 is a schematic layout view illustrating a compensated preliminary mask layout according to an example embodiment of the inventive concepts.
Figure 6:
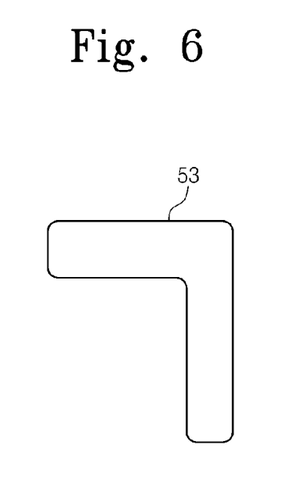
FIG. 6 is a schematic layout view illustrating an image contour obtained from a model simulator with the layout data illustrated in FIG. 5.

If the model error is determined to be out of an allowable range, the preliminary mask layout may be compensated (S33). In one example of such compensation, at least one small auxiliary pattern may be added to the preliminary mask layout or may be removed from the preliminary mask layout. A size of the small auxiliary pattern may be less than a resolution limit of a photolithography process. For example, a line-end treatment or a scattering bar may be added to the preliminary mask layout. Specifically, after comparing the target mask layout 50 of FIG. 3 with the model image contour 51 of FIG. 4, small auxiliary patterns 52 may be added to ends and corners of the mask layout 50, as illustrated in FIG. 5. Subsequently, the model simulator may again operate using the compensated preliminary mask layout and the sample data as input data to obtain another model image data (S31). The steps (S33 and S31) of compensating the preliminary mask layout and of operating the model simulator may be repeatedly performed until the model error is determined to be within the allowable rage. If the model error is within the allowable range, the final compensated preliminary mask layout may be set as an optimized preliminary mask layout (S34). For example, the model simulator may operate using the compensated preliminary mask layout of FIG. 5 and the sample data as input data to generate a model image contour 53 of FIG. 6. If a model error after the comparison between the model image contour 53 of FIG. 6 and the target mask layout 50 of FIG. 3 is in the allowable range, the compensated preliminary mask layout of FIG. 5 may be set as the optimized preliminary mask layout.

Subsequently, referring to FIG. 1, in order to determine whether the optimized preliminary mask layout is truly optimal, a verification step of the optical proximity correction (OPC) may be performed (S40). The verification step (S40) may include operating a verification simulator using the sample data and the optimized preliminary mask layout as input data to obtain a verification image data (S41). In some embodiments, the verification simulator is different from the model simulator. The verification image data may include a plurality of contours, for example, a top contour and a bottom contour, at different vertical positions (heights), CDs, for example, a top CD and a bottom CD, sidewall profiles and corner angle. In order to obtain the plurality of contours, for example, a top contour and a bottom contour, at the different vertical positions, or heights, a plurality of image depths or a plurality of aerial image locations may be initially set. As such, three dimensional images of the patterns obtained from the verification simulator may be virtually realized to estimate which portion of the verification image data is a weak point or whether there is a verification error. The verification image data and the target mask layout data may be compared with each other to detect a verification error (S42). If the verification error is out of the allowable range, an alarm signal may be generated (S43).

FIGS. 7A to 7C, FIGS. 8A to 8C and FIG. 9 are schematic diagrams illustrating procedures to detect errors during compensation and verification of an optical proximity effect according to example embodiments of the inventive concepts.

Figure 7A:
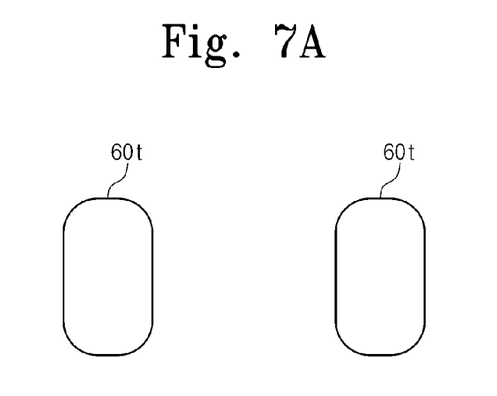
FIGS. 7A to 7C, FIGS. 8A to 8C and FIG. 9 are schematic diagrams illustrating procedures to detect errors during compensation and verification of an optical proximity effect according to example embodiments of the inventive concepts.
Figure 7B:
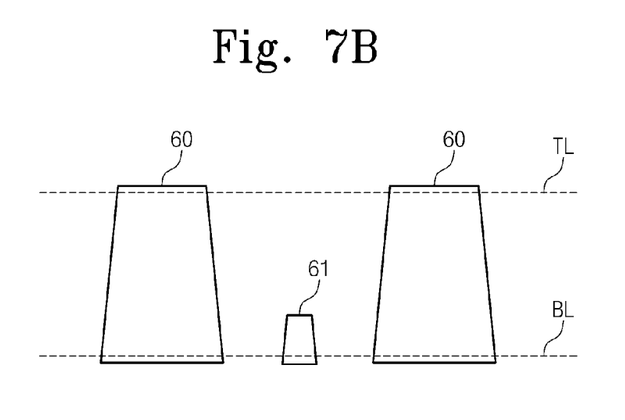
Figure 7C:
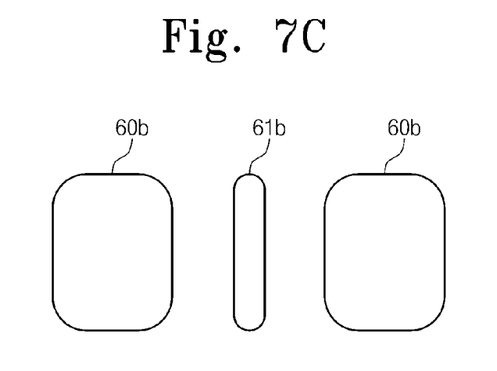

FIG. 7B is a schematic cross-sectional view of first patterns 60. Referring to FIG. 7B, a pair of first patterns 60 may be obtained through the verification simulator, and contours of each of the respective first patterns 60 may be deduced at different vertical positions. The first pattern 60 may be named as a verification-simulated first pattern 60. FIG. 7A is a schematic cross-sectional view of top contours 60t and FIG. 7C is a schematic cross-sectional view of bottom contours 60b. A pair of first top contours 60t and a pair of first bottom contours 60b may be respectively obtained at a top threshold line TL and a bottom threshold line BL of the first patterns 60, as illustrated in FIG. 7B. A first sub-resolution assist feature (SRAF) 61 may be generated between the pair of adjacent first patterns 60, as illustrated in FIGS. 7B and 7C. As illustrated in FIGS. 7A and 7B, while two adjacent first top contours 60t appear at the top threshold line TL, a first assist feature 61b between the pair of adjacent first bottom contours 60b may appear at the bottom threshold line BL. The first sub-resolution assist feature (SRAF) 61 may correspond to a ghost image of a side bar existing in the optimized preliminary mask layout. This first sub-resolution assist feature (SRAF) 61 may be a verification error. However, the first sub-resolution assist feature (SRAF) 61 may be detected as described above. If only a single contour of each of the first patterns 60 is measured at a single vertical position, for example, at a mid height, the first sub-resolution assist feature (SRAF) 61 may not be detected. Thus, according to the example embodiment of the inventive concepts, a plurality of contours may be measured at a plurality of different vertical positions. Thus, it may be easy to detect a sub-resolution assist feature (SRAF) 61. That is, even though a sub-resolution assist feature (SRAF) 61 exists in the verification image data, the sub-resolution assist feature (SRAF) 61 may be detected through the procedure of comparison between the first top contours 60t and the first bottom contours 60b and 61b. If the sub-resolution assist feature (SRAF) 61 is detected, an alarm signal may be generated.

Figure 8A:
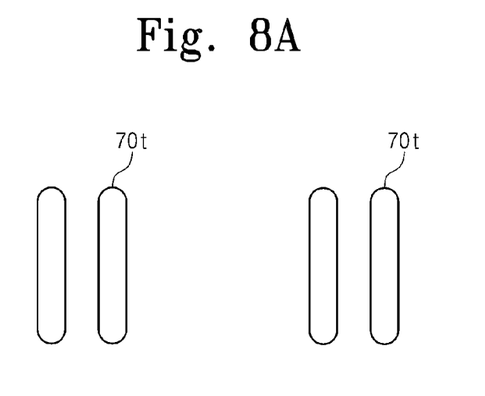
Figure 8B:
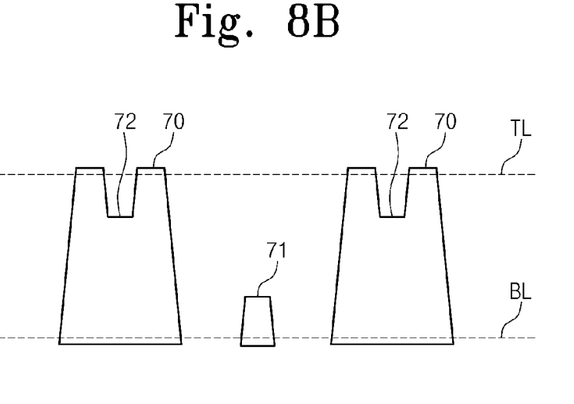
Figure 8C:
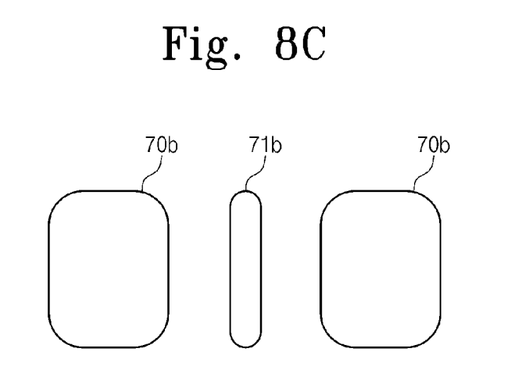

Meanwhile, referring to FIGS. 8A to 8C, a pair of second patterns 70 may be obtained through the verification simulator, and contours of each of the respective second patterns 70 may be deduced at different vertical positions. The second pattern 70 may be named as a verification-simulated second pattern 70. FIG. 8B is a schematic cross-section of second patterns 70. In FIG. 8B, an upper portion of each of the second patterns 70 may have a recessed portion 72 and a sub-resolution assist pattern 71 may be formed to be apart from the second patterns 70 between the second patterns 70. The recessed portion 72 and the sub-resolution assist pattern 71 may correspond to side lobe images.

FIG. 8A is a schematic cross-sectional view of top contours 70t and FIG. 8C is a schematic cross-sectional view of bottom contours 70b. A second top contour 70t and a second bottom contour 70b of each second pattern 70 may be respectively obtained at a top threshold line TL and a bottom threshold line BL of the first patterns 70, as illustrated in FIG. 8B. As illustrated in FIG. 8A, each of the second top contours 70t may include a pair of bar-shaped patterns which are separated from each other. This is formed because of the recessed portion 72 (which corresponds to a side lobe image) on the second pattern 70. In the case that a side lobe image is formed inside the photoresist pattern like the upper portion of the second patterns 70, an error referred to as a side lobe in resist (SIR) may be detected to generate an alarm message "SIR". A second sub-resolution assist feature (SRAF) 71b may appear between the second bottom contours 70b, similar to the example embodiment of FIGS. 7A to 7C. This error may be detected as a sub-resolution assist feature (SRAF) or a side lobe out resist (SOR). As a result, the second top contours 70t may generate the alarm message "SIR", and the second bottom contours 70b may generate the alarm message "SOR".

Figure 9A:
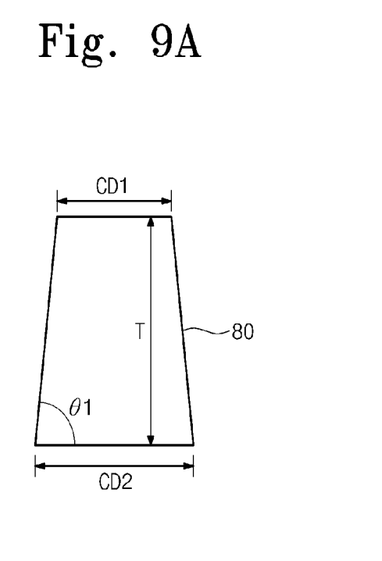
Figure 9B:
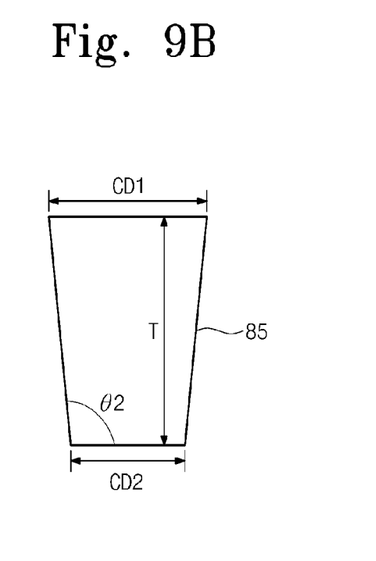

FIGS. 9A and 9B are schematic cross-sectional views of third pattern 80 and fourth pattern 90, respectively. Referring to FIGS. 9A and 9B, a third pattern 80 and a fourth pattern 85 may be obtained through the verification simulator, and CD differences between top critical dimensions CD1 and bottom critical dimensions CD2, a thickness T and corner angles θ1 and θ2 of the third and fourth patterns 80 and 85 may be deduced from the verification image data of the third and fourth patterns 80 and 85. The corner angles θ1 and θ2 may be calculated using the thickness T and the CD difference, as expressed by the following equation 1.

$$\theta 1, \theta 2 = \text{Tan}^{-1} \frac{T}{(CD1 - CD2)/2} \qquad \text{Equation 1}$$

In the case of the third pattern 80, as illustrated in FIG. 9A, the top critical dimension CD1 is less than the bottom critical dimension CD2, and the lower corner angle θ1 is less than 90°. Accordingly, the third pattern 80 may have a positive sidewall profile as illustrated in FIG. 9A. When the verification image data has the positive sidewall profile and the lower corner angle θ1 or the CD difference is out of a specific allowable range, a verification error such as a footing or a bridge may occur. Thus, an alarm signal of the footing or the bridge may be generated.

In the case of the fourth pattern 85, as illustrated in FIG. 9B, the top critical dimension CD1 is greater than the bottom critical dimension CD2, and the lower corner angle θ2 is greater than 90°. Accordingly, the fourth pattern 85 may have a negative sidewall profile as illustrated in FIG. 9B. When the verification image data has the negative sidewall profile and the lower corner angle θ2 or the CD difference is out of a specific allowable range, a verification error such as a necking may occur. Thus, an alarm signal of the necking may be generated.

As described above and as illustrated in FIG. 1, if the verification error is out of the allowable range, the alarm signal may be generated (S43) to return to the step of compensating the preliminary mask layout (S33) or the step of setting the target mask layout data (S20). That is, if the verification error is out of the allowable range, the preliminary mask layout may be compensated again or the target mask layout data may be reset. If the verification error is within the allowable range, the optimized preliminary mask layout may be set as a final mask layout (S44) and a photo mask may be fabricated using the final mask layout (S50). The verification error may be an error type such as the SIR or SOR. Alternatively, the verification error may be an error degree whether the verification image data such as an angle or a CD difference are out of a tolerance or not.

Then, a semiconductor device may be formed by using the photo mask. That is, a wafer is prepared and a photoresist layer is formed on the wafer. Then a photolithography process is performed with respect to the wafer using the photo mask, thereby forming photoresist patterns. The photoresist patterns may be used as etch mask for forming a semiconductor device.

According to the embodiments set forth above, when the optimized mask layout is verified, three dimensional verification image data of patterns may be obtained and the verification image data may be compared with a target mask layout data which are previously set. During the comparison between the verification image data and the target mask layout data, an error such as a sub-resolution assist feature (SRAF), a side lobe, a bridge or a necking may be detected. As such, accuracy of the optical proximity correction (OPC) may be improved and a high reliable photo mask may be fabricated.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative. Thus, the scope of the inventive concepts is to be determined by the broadest permissible interpretation of the following claims and their equivalents, and shall not be restricted or limited by the foregoing description.

What is claimed is:

1. A method of fabricating a photo mask, the method comprising:
    collecting sample data;
    setting a target mask layout data;
    performing an optical proximity correction using the sample data and a preliminary mask layout to obtain an optimized preliminary mask layout;
    verifying the optimized preliminary mask layout to obtain a final mask layout; and
    fabricating the photo mask using the final mask layout,
    wherein verifying the optimized preliminary mask layout includes operating a verification simulator using the sample data and the optimized preliminary mask layout as input data to obtain verification image data, and
    wherein the verification image data includes a plurality of contours of a verification-simulated pattern at different vertical positions.

2. The method of claim 1, wherein verifying the optimized preliminary mask layout further comprises:
    comparing the verification image data with the target mask layout data to detect a verification error; and
    determining whether the verification error is out of an allowable range,
    wherein the verification image data further include a plurality of critical dimensions of the verification-simulated pattern at different vertical positions, a sidewall profile and a corner angle.

3. The method of claim 2, wherein comparing the verification image data with the target mask layout data to detect a verification error includes comparing the plurality of contours of the verification-simulated pattern to detect a subresolution assist feature and a side lobe image.

4. The method of claim 3, wherein the detecting of the verification error detects a side lobe in resist if the side lobe image is formed in the verification-simulated pattern, and
    wherein the detecting the verification error detects a side lobe out resist if the side lobe image is formed to be apart from the verification-simulated pattern.

5. The method of claim 2, wherein comparing the verification image data with the target mask layout data to detect a verification error includes calculating a difference between the plurality of critical dimensions of the verification-simulated pattern to detect a bridge or a necking.

6. The method of claim 2, wherein comparing the verification image data with the target mask layout data to detect a verification error includes calculating the corner angle to detect a bridge or a necking.

7. The method of claim 2, wherein, if the verification error is out of the allowable range, the preliminary mask layout is compensated and the optical proximity correction and the verification of the optimized preliminary mask layout are again performed using the compensated preliminary mask layout.

8. The method of claim 2, wherein, if the verification error is out of the allowable range, the target mask layout data is reset and the optical proximity correction and the verification of the optimized preliminary mask layout are again performed using the reset target mask layout data.

9. The method of claim 2, further comprising generating an alarm message indicating the verification error when the verification error is out of the allowable range.

10. The method of claim 1, wherein performing the optical proximity correction comprises:
    operating a model simulator using the sample data and the preliminary mask layout as input data to obtain a model image data in which an optical proximity effect is reflected;
    comparing the model image data with the target mask layout data to detect a model error; and
    determining whether the model error is out of an allowable range.

11. The method of claim 10, wherein, if the model error is out of the allowable range, the preliminary mask layout is compensated and the optical proximity correction and the verification of the optimized preliminary mask layout are again performed using the compensated preliminary mask layout.

12. The method of claim 10, wherein the verification simulator is different from the model simulator.

13. The method of claim 1, wherein collecting the sample data comprises:
performing exposure and development processes using a test mask having test patterns of various sizes, various shapes and various spaces to form photoresist patterns; and
measuring thicknesses of the photoresist patterns, corner angles of the photoresist patterns, sidewall profiles of the photoresist patterns, critical dimensions at different vertical positions of the photoresist patterns, and contours of the photoresist patterns.

14. The method of claim 13, wherein measuring the thicknesses, the corner angles, the sidewall profiles, the critical dimensions and contours of the photoresist patterns is performed using one of a top-view critical dimension scanning electron microscope (CD SEM) and an angled critical dimension scanning electron microscope (CD SEM).

15. The method of claim 1, wherein the contours include a top contour and a bottom contour of the verification-simulated pattern, and the top contour and the bottom contour are obtained at different vertical positions of the verification-simulated pattern.

16. A method of forming a semiconductor device, comprising:
preparing a wafer;
forming a photoresist layer on the wafer; and
forming photoresist patterns by perfoming a photolithography process with respect to the wafer using a photo mask formed by the method of claim 1.

17. A method of fabricating a photo mask, the method comprising:
collecting sample data;
setting a target mask layout data;
performing an optical proximity correction using the sample data and a preliminary mask layout to obtain an optimized preliminary mask layout;
verifying the optimized preliminary mask layout by generating verification image data and comparing the verification image data with the target mask layout data to detect a verification error;
generating an alarm message indicating the verification error when the verification error is out of an allowable range and obtaining a final mask layout when the verification error is within the allowable range; and
fabricating the photo mask using the final mask layout.

18. The method of claim 17, wherein verifying the optimized preliminary mask layout includes operating a verification simulator using the sample data and the optimized preliminary mask layout as input data to obtain the verification image data, and wherein the verification image data includes a plurality of contours of a verification-simulated pattern at different vertical positions.

19. The method of claim 18, wherein verifying the optimized preliminary mask layout further comprises:
determining whether the verification error is out of an allowable range,
wherein the verification image data further include a plurality of critical dimensions of the verification-simulated pattern at different vertical positions, a sidewall profile and a corner angle.

20. The method of claim 19, wherein comparing the verification image data with the target mask layout data to detect a verification error includes comparing the plurality of contours of the pattern to detect a sub-resolution assist feature and a side lobe.

21. The method of claim 19, wherein comparing the verification image data with the target mask layout data to detect a verification error comprises at least one of calculating a difference between the plurality of critical dimensions of the verification-simulated pattern to detect a bridge or a necking and calculating the corner angle to detect a bridge or a necking.

22. The method of claim 17, wherein the verification image data includes a top contour and a bottom contour of a verification-simulated pattern, and the top contour and the bottom contour are obtained at different vertical positions of the verification-simulated pattern.

* * * * *